(12) United States Patent
Zweig et al.

(10) Patent No.: US 6,611,678 B1
(45) Date of Patent: Aug. 26, 2003

(54) DEVICE AND METHOD FOR TRAINABLE RADIO SCANNING

(75) Inventors: Geoffrey Zweig, Greenwich, CT (US); Chalapathy Neti, Yorktown Heights, NY (US)

(73) Assignee: IBM Corporation, Armonk, NY (US)

( * ) Notice: Subject to any disclaimer, the term of this patent is extended or adjusted under 35 U.S.C. 154(b) by 473 days.

(21) Appl. No.: 09/677,086

(22) Filed: Sep. 29, 2000

(51) Int. Cl.[7] .................................................. H04B 1/16
(52) U.S. Cl. ................................ 455/161.3; 455/186.1; 455/158
(58) Field of Search ................................ 455/158, 161, 455/157, 186.1, 186, 161.3

(56) References Cited

U.S. PATENT DOCUMENTS

| | | | | |
|---|---|---|---|---|
| 4,355,412 A | * | 10/1982 | Kawakami ................ | 455/175.1 |
| 4,969,209 A | * | 11/1990 | Schwob .................... | 455/158.4 |
| 5,654,719 A | * | 8/1997 | Kunii ........................ | 342/451 |
| 5,842,119 A | * | 11/1998 | Emerson et al. ......... | 455/161.3 |
| 5,991,442 A | | 11/1999 | Yamada et al. | |
| 6,112,064 A | * | 8/2000 | Arrowsmith et al. .... | 455/186.1 |
| 6,198,779 B1 | * | 3/2001 | Taubenheim et al. ....... | 375/316 |
| 6,289,207 B1 | * | 9/2001 | Hudecek et al. ......... | 455/150.1 |

* cited by examiner

*Primary Examiner*—Thanh Cong Le
*Assistant Examiner*—Tan Trinh
(74) *Attorney, Agent, or Firm*—Dilworth & Barrese, LLP

(57) ABSTRACT

A trainable radio scanner, including a station monitoring circuit to scan a plurality of radio frequencies and extract audio samples of a predetermined duration from each one of the plurality of radio frequencies having a signal strength above a reception threshold; a memory storing audio classification data and the plurality of audio samples; and an audio analyzer to analyze each one of the plurality of audio samples using the audio classification data and classifies each audio sample into a musical style category; a style discriminator to control a radio station scanning operation of the radio receiver to tune only to preferred radio stations having a radio frequency at which the corresponding audio sample is classified in at least one preferred musical style category.

24 Claims, 6 Drawing Sheets

DEVICE AND METHOD FOR TRAINABLE RADIO SCANNING

BACKGROUND OF THE INVENTION

1. Field of the Invention

The present invention relates to radio receivers, and more particularly to a trainable scanning device and method for radio receivers.

2. Background of the Invention

Radio receivers capable of electronically tuning to a desired broadcast frequency (station) are commonplace today. The desired station is generally selected by a user using one of three methods: manually moving incrementally up or down through the band with a tuning knob or buttons; moving directly to a previously programmed user (preset) station by pushing a button; or using a seek or scan feature of the radio to search the band for stations having a signal strength above a minimum threshold level.

The later method requires a user to hear a sampling of the broadcast on each station and determine whether it is desirable to either select the station or await to hear a sampling of the next station. This method of finding a station presents an inconvenience to the user, since a user is required to sequentially sample each station until he can locate one matching his musical taste. This can often be a long and tedious process for a user.

In addition, during a scan mode, each station is sampled for only a short period of time before moving on to the next station automatically. When the short sampling period coincides with a commercial on a station, the user is prevented from sampling the music available on that station.

During a seek mode a user is required to repeatedly press a seek button on the radio, or at least monitor the seek button to press it to stop seeking. Thus, a user is prevented from focusing his attention on other tasks, like driving a motor vehicle.

Using preset station buttons (presets) has drawbacks as well. A user is required to reprogram the presets when he enters a new area with the radio. For instance, a car radio's presets are set to desired stations in the immediate broadcast area and will be ineffective once the car leaves the area. Additionally, a user gets accustomed to hearing only the preset stations and may not appreciate when other stations meeting his musical taste (or talk radio, sports radio, etc.) are available.

Therefore, a scan device is needed which analyzes the music a user listens to and seeks only stations that broadcast that style of music, or a style of music selected by a user.

SUMMARY OF THE INVENTION

It is therefore an aspect of the present invention to provide a trainable radio scanner which allows a user to scan only radio stations matching a user pre-selected musical style.

It is another aspect of the present invention to provide a trainable radio scanner which allows a user to scan only radio stations matching a predetermined musical style, the musical style being determined by analyzing a user's most commonly listened to musical style.

It is yet another aspect of the present invention to provide a method for trainable radio scanning which allows a user to scan only radio stations matching a user pre-selected musical style.

It is still another aspect of the present invention to provide a method for trainable radio scanning which allows a user to scan only radio stations matching predetermined musical styles, the musical style being determined by analyzing a user's most commonly listened to musical style.

To achieve the above aspects, a trainable radio scanner, in accordance with the present invention is provided which comprises a station monitoring circuit to scan a plurality of radio frequencies and extract audio samples of a predetermined duration from each one of the plurality of radio frequencies having a signal strength above a reception threshold; a memory storing audio classification data and the plurality of audio samples; an audio analyzer to analyze each one of the plurality of audio samples using the audio classification data and to classify each audio sample into a musical style category; and a style discriminator to control a radio station scanning operation of the radio receiver to tune only to preferred radio stations having a radio frequency at which the corresponding audio sample is classified in at least one preferred musical style category, wherein the at least one preferred musical style category is previously selected.

A method of trainable radio scanning in accordance with the present invention includes scanning a plurality of radio station frequencies and extracting audio samples from each one of the plurality of radio stations; classifying each of the audio samples into one of a plurality of musical style categories; determining a user's preferred musical styles; storing a list of station identification data of radio stations having corresponding audio samples classified in the user's preferred musical styles; and scanning only to stations identified in the list during a scanning procedure of the radio.

BRIEF DESCRIPTION OF THE DRAWINGS

The above and other aspects, features, and advantages of the present invention will become more apparent in light of the following detailed description of an exemplary embodiment thereof taken in conjunction with the attached drawings in which.

DETAILED DESCRIPTION OF THE PREFERRED EMBODIMENT

Figure 1:
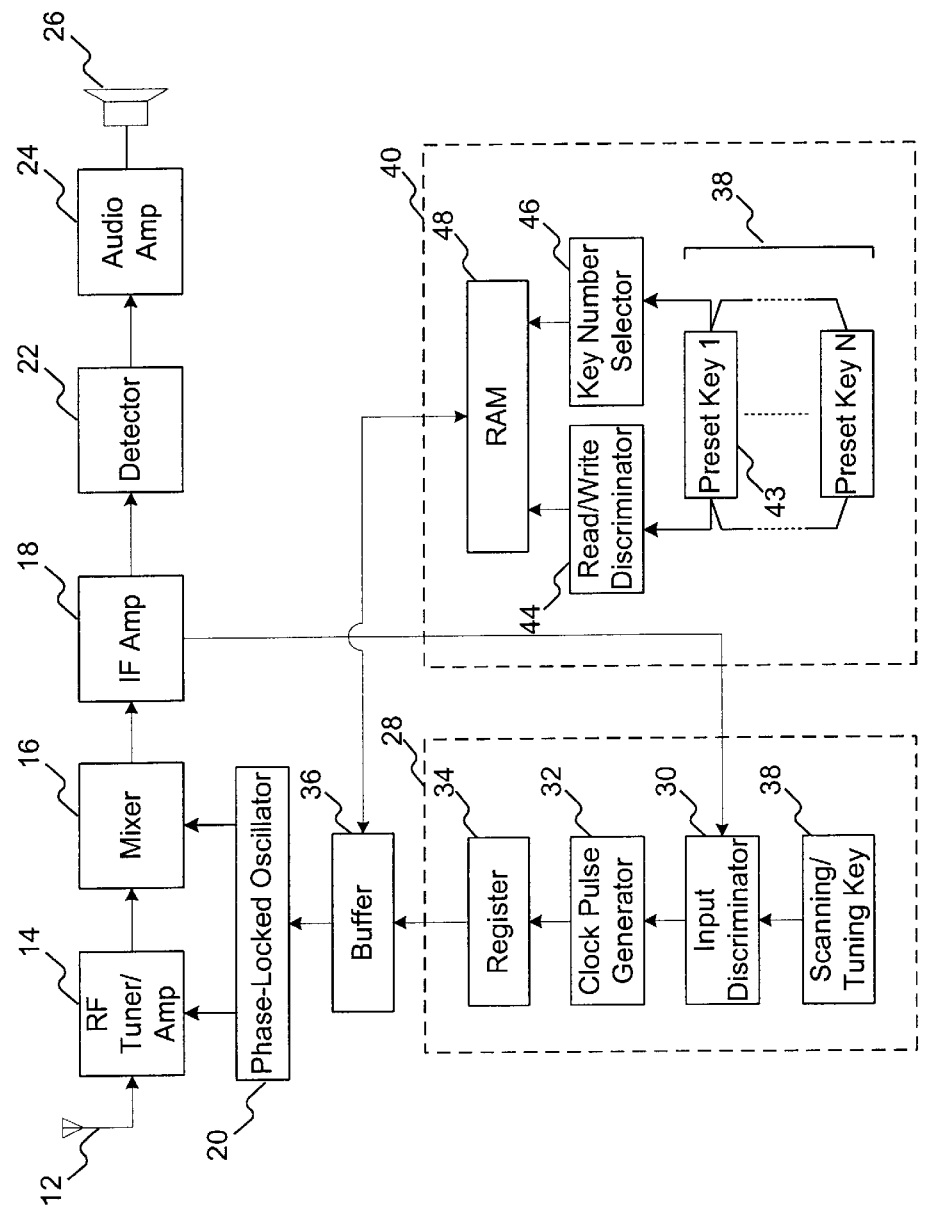
FIG. 1 is a block diagram illustrating a conventional radio receiver in accordance with the prior art.

Turning now to the drawings, in which like reference numerals identify similar or identical elements throughout the several views, FIG. 1 illustrates a typical radio receiver 10 in accordance with the prior art.

Referring to FIG. 1, an RF (radio frequency) signal is received by an RF tuner and amplifier circuit 14 via antenna 12. The RF signal is converted to an IF (intermediate frequency) signal in mixer 16. A phase-locked oscillator circuit 17 includes a phase locked loop which sets a tuning frequency and a local oscillation frequency for the RF tuner and amplifier circuit 14 and the mixer 16. An IF amplifier 18 amplifies the IF signal from mixer 16. The amplified IF signal is converted to a low frequency audio signal in detector 22 and amplified in audio frequency amplifier 24 to drive speaker 26.

A seek or scan function of the receiver is performed by scanning circuit 28. In scanning circuit 28 an input discriminator 30 senses when a seek/scan tuning function is activated and increments or decrements a value in register 34 according to clock pulses received from clock pulse generator 32. The IF input signal at the IF amplifier 18 is monitored by input discriminator 30. When the IF signal exceeds a threshold level, a station is found and the discriminator 30 causes the clock pulse generator 32 to stop sending pulses to the register 34. The register 34 then transfers its contents to buffer 36 and on to the phase-locked oscillator circuit 20 to thereby tune the RF tuner and amplifier 14 and the mixer 16 to the corresponding new station frequency.

A preset station circuit 40 includes at least one preset key 42 which during a write mode assigns a station to a corresponding preset key 43. The station is assigned by sending a write command to a read/write discriminator 44 by actuating the preset key 43 in a write or program mode. The read/write discriminator 44 places a RAM 48 in a write enable state. Meanwhile the key number selector 46 specifies an address value corresponding to the preset key number to the RAM 48. The corresponding value in buffer 36 for the current station is written at the specified address in the RAM 48, which assigns the station to the corresponding preset key 43.

To recall the preset station, the preset key 43 is pressed during a normal or read mode. The read/write discriminator 44 sends a read command to RAM 48 at the corresponding address supplied by the key number selector 46. The value, at the corresponding address in the RAM 48 is transferred to the buffer 36 and on to phase-locked oscillator circuit 20 to thereby tune the RF tuner and amplifier 14 and the mixer 16 to the corresponding new frequency.

Figure 2:
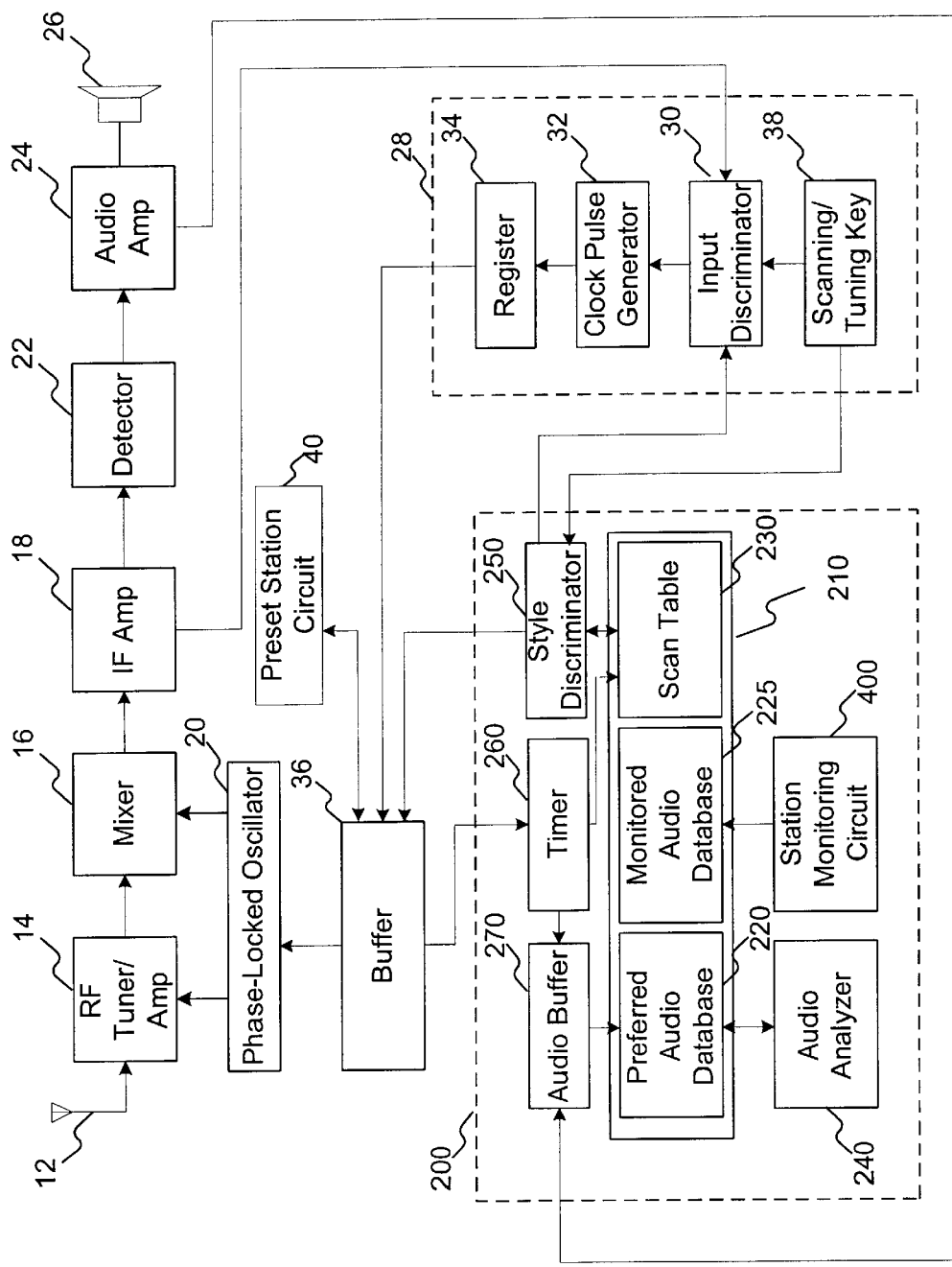
FIG. 2 is a block diagram illustrating a radio receiver having a trainable radio scanner in accordance with the present invention.

Referring now to FIG. 2, FIG. 2 illustrates the radio receiver of FIG. 1 with a trainable radio scanner 200 in accordance with the present invention. In FIG. 2, the trainable radio scanner 200 includes a timer 260, a RAM 210, an audio analyzer 240, a style selector 250 and station monitoring circuit 400. The RAM 210 is divided into a preferred audio data base region 220, monitored database region 225 and a scan table region 230. The preferred audio data base 220 stores a collection of audio samples for various musical styles. These samples may be of variable duration from several seconds to several hours. Here, the audio samples may be acoustic waveforms, or processed versions thereof, such as spectral representations of the waveforms.

Figure 3:
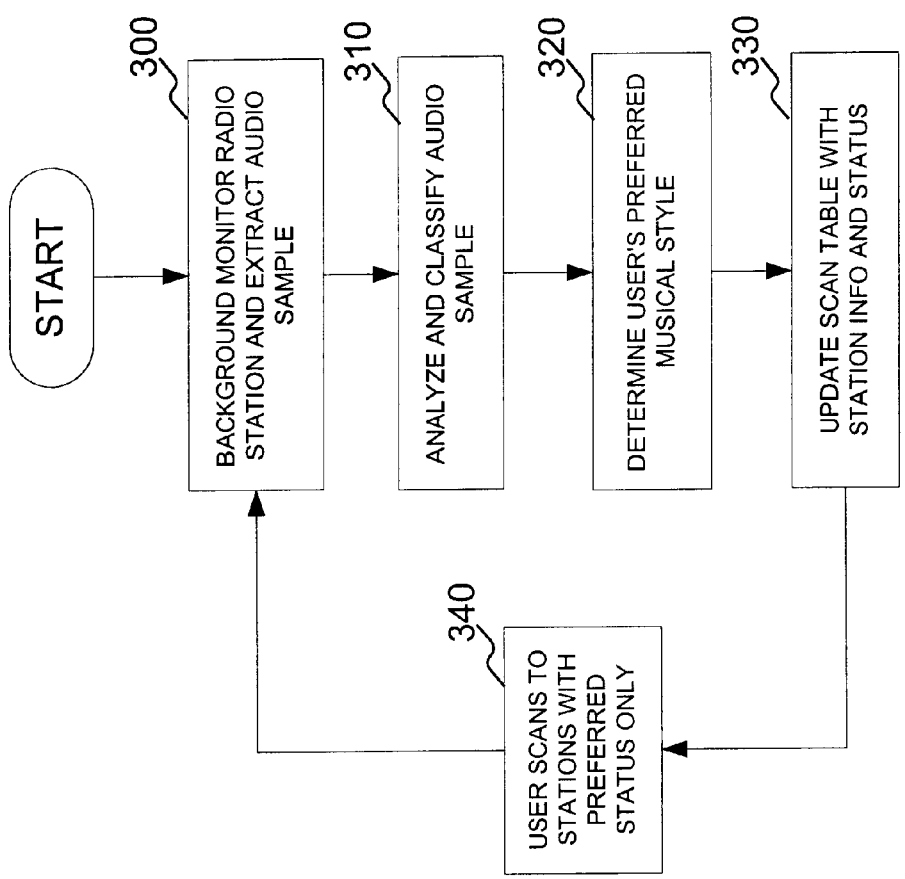
FIG. 3 is a flow chart illustrating a trainable radio scanning procedure in accordance with the present invention.

Referring also to FIG. 3, a flowchart is illustrated setting forth a method of trainable scanning in accordance with the present invention. The method generally includes background scanning all radio stations having good reception in step 300 by station monitoring circuit 400. As the stations are monitored, an audio sample is extracted from each and stored in the monitored audio database 225. Each extracted audio sample is then analyzed and classified in step 310. Next, a user's preferred musical style is determined in step 320, with reference to the preferred audio database. In step 330, a scan table 230 is updated storing station identification data for each station together with its classification and a preferred status or disliked status. Finally, in step 340, the scan table 230 is used to scan only the stations having a preferred status. Here, FIG. 3 is provided to illustrate an overall method for the present invention with each step further detailed hereinbelow.

In one embodiment of the present invention, a static data base model is implemented. That is, the preferred audio data base is preprogrammed with a fixed set of musical styles. The styles may represent widely accepted genres, such as blues, classical, jazz, etc. In an expanded version of the data base, the musical styles may also represent advertising segments, talk shows, foreign language stations, etc. In addition, a background data base is collected that contains samples that do not fall into any of these categories.

Figure 7:
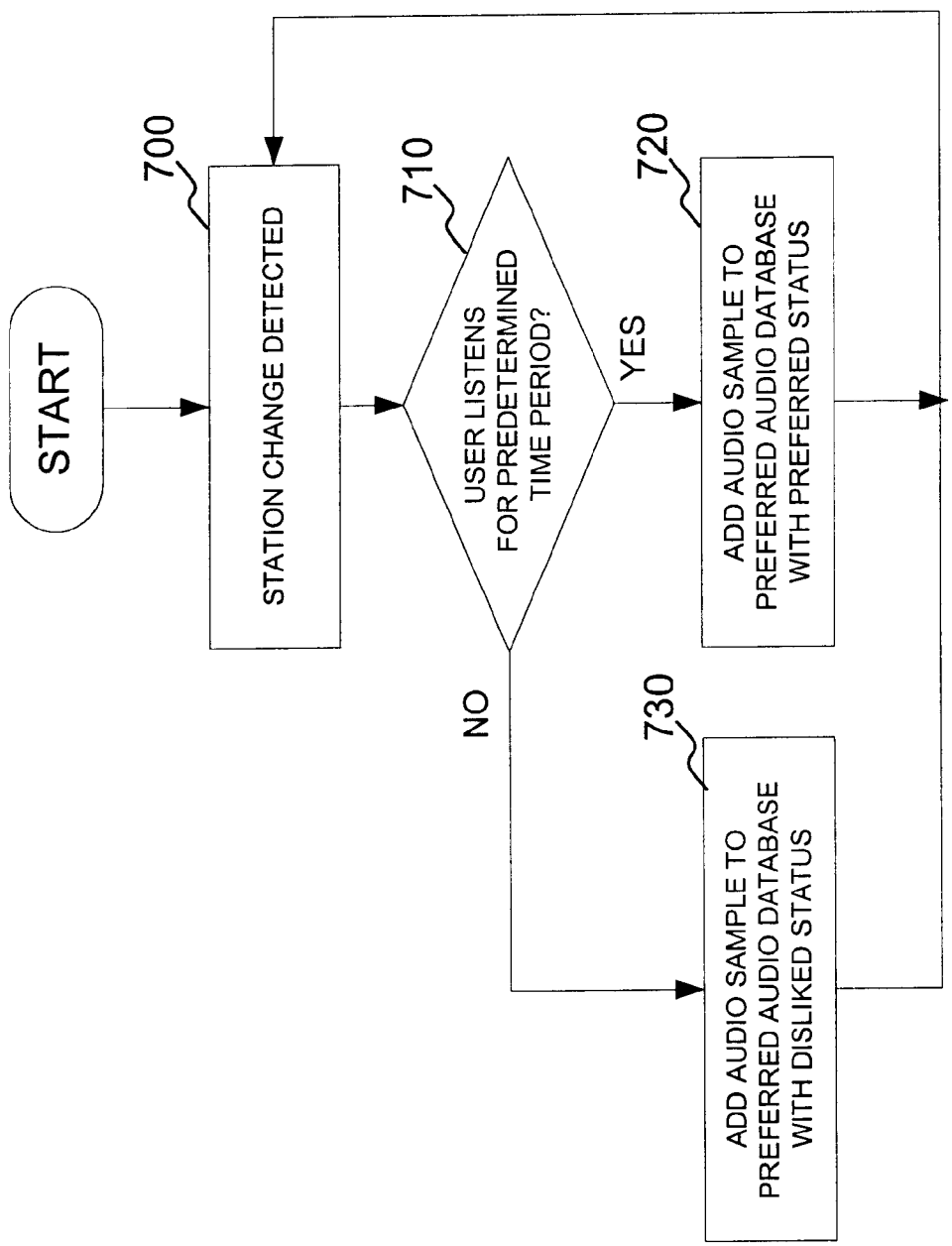
FIG. 7 is a flow chart illustrating a method of monitoring a user's listened-to radio stations in accordance with the present invention.

The preferred audio data base 220 may also be collected dynamically in a preferred embodiment of the present invention. That is, the collection of musical samples is created while the user listens to the radio to specifically represent the user's musical style preferences. The dynamic data base collection is created by continually monitoring the user's selected stations. The dynamic data base creation process is illustrated with reference to the flowchart of FIG. 7 in conjunction with FIG. 2. In step 700, a station change is detected when a new value is written to buffer 36, thereby initiating timer 260 and clearing audio buffer 270. Audio buffer 270 continually records the audio signal from the input state of audio amp 24. Meanwhile, upon the next station change detected at buffer 36, it is determined in step 710 whether a predetermined time period has elapsed in timer 260. If the predetermined time period has elapsed, in step 720 the audio sample in audio buffer 270 is written into the preferred audio data base 220. Accordingly, in step 720, since the predetermined time period has elapsed, the audio sample from audio buffer 270 is analyzed in audio analyzer 240 and the corresponding audio characteristics are stored with a preferred status flag in the preferred audio data base 220. Here, the audio sample in audio buffer 270 may be of a length less than the predetermined time period.

However, when a station change is detected in buffer 36 prior to the predetermined time period elapsing, in step 730 the audio sample in audio buffer 270 is analyzed in audio analyzer 240 and the corresponding audio characteristics are stored with a disliked flag status in preferred audio database 220 in step 730.

A database is thereby created containing samples of a user's preferred musical style. In the simplest embodiment of the dynamic data base collection, the audio samples are collected only once. In a more sophisticated embodiment, the collection is ongoing and older samples may be discarded as newer ones are added.

Figure 5:
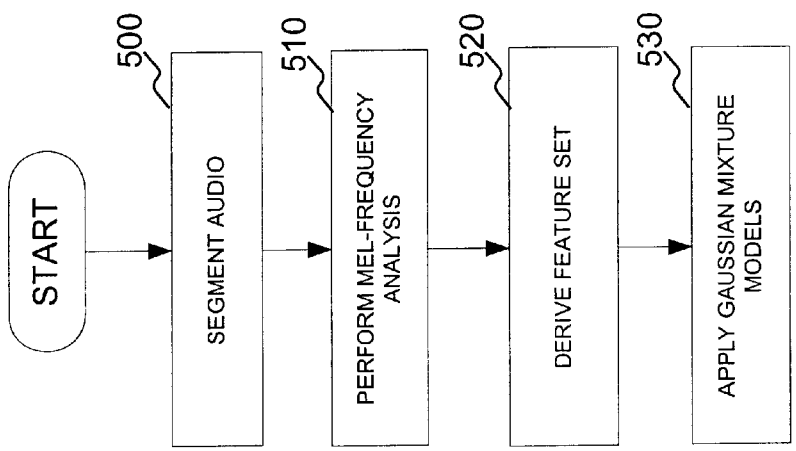
FIG. 5 is a flow chart illustrating a preferred method of analyzing an audio sample in accordance with the present invention.

As audio samples are collected, the audio analyzer 240 continually analyzes the samples and processes a corresponding set of characteristics to define the preferred musical style using known audio processing techniques. One example of a preferred audio processing technique is illustrated in FIG. 5. In FIG. 5, the audio data is first divided into a sequence of short duration segments, such as 20–50 ms, in step 500. Then, a mel-frequency spectral representation of each segment is obtained using known speech recognition techniques in step 510. A set of features is derived from the cumulative data in step 520 and stored in the preferred audio database 220. For example, the features may include a fraction of the overall signal energy that is in different spectral frequency regions, the average absolute rate-ofchange of energy in different frequency bins; and/or the average correlation level between the amount of energy in different time-frequency regions.

Using the above feature values, a corresponding pattern is formed representing the audio sample. A wide variety of pattern classifiers may then be implemented to categorize the patterns into the different musical styles. The pattern classifiers employ known pattern recognition techniques to categorize the patterns according to probability functions, such as a Gaussian distribution function. The pattern classifiers used may include decision trees, mixtures-of-gaussians, and nearest-neighbor classifiers. In the preferred embodiment illustrated in FIG. 5, a mixture-of-gaussians classifier is used to model examples of the various styles, one for each style, in step 530.

Accordingly, a preferred audio database 220 stores the cumulative representative patterns from the preferred audio samples and the disliked audio samples in the dynamic database model. The patterns are then classified into preferred and disliked musical styles, respectively, to select the appropriate pattern classifier, for use in later comparison with each broadcast radio station's musical style.

Therefore, using either the static or dynamic database model, preferred pattern classifiers are derived which represent the user's preferred musical styles. The preferred pattern classifiers are employed to select broadcast radio stations having the same musical style during a background scanning procedure.

Figure 6:
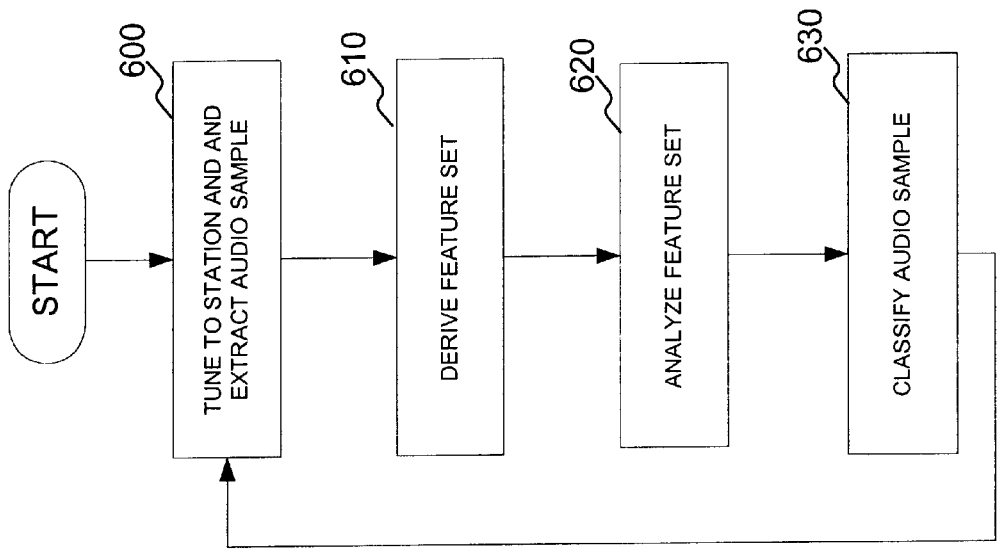
FIG. 6 is a flow chart illustrating a preferred method of classifying an analyzed audio sample in accordance with the present invention.

The background scanning procedure is illustrated in the flowchart in FIG. 6, with reference to FIG. 2. Referring to FIG. 6, a station with good reception is tuned in by station monitoring circuit 400 in step 600. Station monitoring circuit 400 will be described in more detail below with reference to FIG. 4. An audio sample is extracted from each station and stored in the monitored audio database 225 as station monitoring circuit 400 scans the various stations. The scanning is done in the background continuously. While a user is listening to one station, station monitoring circuit 400 is scanning all the stations in the background.

Each station's audio sample is stored in the monitored audio database 225. In step 610, a set of features is derived from the audio samples by audio analyzer 240 as described above. The audio analyzer 240 then analyzes the feature sets in step 620 and classifies them into the various musical styles using the classifiers derived and stored in the preferred audio database, in step 630. For example, a sample is classified by analyzing the corresponding set of features and computing the likelihood of a match with each musical style, preferably using a mixture-of-gaussians model. The sample is then classified as belonging to the audio style with the highest likelihood. In the static database model, all the predefined musical styles are compared and the audio sample is classified accordingly. In the dynamic database model, the audio samples are classified according to the user's preferred musical style.

In either case, the procedure of FIG. 6 is repeated for each station scanned until all stations having good reception are classified.

Meanwhile, the station monitoring circuit 400 writes a corresponding record for each station scanned into a scan table 230 of the RAM 210. As each audio sample is classified, a classification field is updated in the corresponding record for the station. In addition, a scan flag of the record is set to yes or no. An example of a scan table is illustrated in Table 1 below.

TABLE 1

| Station Id | Classification | Band | Scan |
|---|---|---|---|
| 95.5 | 00 (Jazz) | 00 (FM) | 0 |
| 98.3 | 01 (Blues) | 00 (FM) | 1 |
| 660 | 09 (Talk) | 01 (AM) | 0 |
| 880 | 08 (Classical) | 01 (AM) | 0 |
| . | . | | . |
| . | . | | . |
| . | . | | . |
| 102.3 | 02 (Rock) | 00 (FM) | 1 |
| 106.1 | 01 (Blues) | 00 (FM) | 1 |

In the example scan table of Table 1, a station Id field may simply contain a buffer value for buffer 36. A classification field contains a numerical value corresponding to the style of music classified for that station during the classification process of FIG. 6. Here, the predefined classifiers may be used in the static database model or a simple preferred/not preferred classification may be used in the dynamic database model. The band on which the station resides is also stored in a corresponding field. Lastly, a scan flag is set to 0 or 1, with 1 representing a record containing a classification which a user prefers. That is, as each record is created a scan field value is set to 1 when the station is classified into a musical style that is preferred by the user, as indicated in the preferred audio database 220. In the dynamic database model, these classifications represent the user's most commonly listened to musical styles. In the static database, the classifications represent the user selected musical styles, where a user selects his preferred musical styles using as menu or button on the radio itself, thus creating the entries in the scan field of the scan table.

Figure 4:
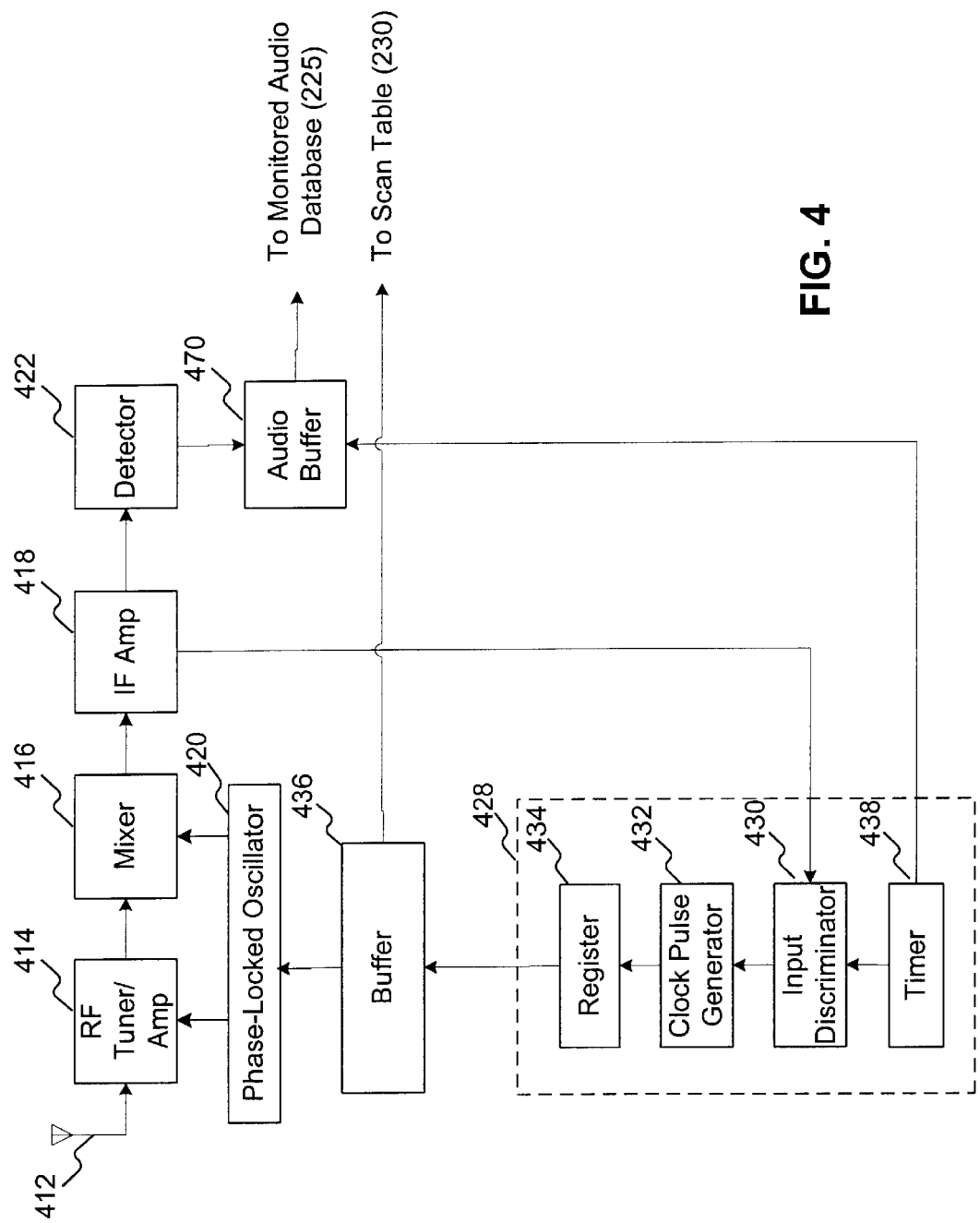
FIG. 4 is a block diagram illustrating a station monitoring circuit in accordance with the present invention.

The station monitoring circuit 400 of FIG. 2 is illustrated in greater detail with reference to FIG. 4. In FIG. 4, an RF tuner and amplifier 414, an antenna 412, an IF amplifier 418 and a detector 422 is employed to convert a received RF signal to a low frequency audio signal as described above with reference to FIG. 1.

An automatic scanning circuit 428 contains a clock pulse generator 432, a register 434, an input discriminator 430 and a timer 438. The timer 438 is set to lapse after a predetermined audio sample duration period. This period may be from several seconds to several hours. In a preferred embodiment, the timer 438 is set to lapse after one minute. The input discriminator 430 senses when the timer 438 has lapsed and increments or decrements a value in register 434 using clock pulses generated by clock pulse generator 432.

When the IF signal from the input state of IF amplifier 418 exceeds a threshold value, a station is found and the discriminator 430 causes the clock pulse generator 432 to stop sending pulses to the register 434. The register 434 then transfers its contents to buffer 436 and on to phase-locked oscillator circuit 420 to thereby tune the RF tuner and amplifier 414 and mixer 416 to the corresponding new station frequency. The process continuously repeats each time the timer 438 lapses.

As each consecutive station is tuned in, audio buffer 470 records an audio sample from the output of detector 472. Consequently, each time timer 438 lapses, an audio sample is transferred from the audio buffer 470 to the monitored audio database 225 and the corresponding station's buffer value is transferred from buffer 436 to a corresponding record in scan table 230. The process continually repeats, thereby providing audio samples from all stations having good reception to audio analyzer 240 for classification as described above.

As a result of the above-described processes, the scan table is continually updated with radio station identifiers for stations having good reception. A scan field in the scan table identifies the records which match the user's preferred musical style.

In operation, the scan table is accessed such that only stations having a preferred status (a "1" in the status field) are tuned in during a scanning operation, and all other stations are skipped. More particularly, with reference to FIG. 2, a style discriminator 250 senses when the scanning/tuning key 38 is activated. If a user has activated a preferred station only feature in the radio, style discriminator 250 prevents input discriminator 30 from incrementing/decrementing register 34. Instead, the style discriminator 250 transfers the station Id value from the next record in the scan table 230 having preferred status to the buffer 36. The buffer 36 then transfers the value to the phase-locked oscillator circuit 20 to tune the radio to the next station having a preferred status.

Accordingly, when a preferred station only feature is activated by a user, use of the scan feature results in scanning only to stations having a musical style preferred by the user. As described above, in the static database model, the user selects the preferred musical styles while in the dynamic database model the user's preferences are determined by sampling the musical styles the user most commonly uses. It should be noted that the present invention is not limited to selecting one of the two models, but in a preferred embodiment incorporates both the static and dynamic models and implements either under the control of the user.

Accordingly, the present invention has advantages over the prior art in that a user need only scan to stations that match his preferred style. Additionally, when a user enters a new area with the radio, all stations in the area are automatically scanned in the background. Those stations matching the user's preference are added to the scan table with a preferred status. A user may then scan stations matching only his preferred musical style, even while in an unfamiliar area.

While the present invention has been shown and described in detail with reference to the preferred embodiments, they represent mere exemplary applications. Thus, it is to be clearly understood that many variations can be made by anyone having ordinary skill in the art while staying within the spirit and scope of the present invention as defined by the appended claims.

What is claimed is:

1. A radio scanner operatively connected to a radio receiver, said radio scanner comprising:
   a station monitoring circuit to scan a plurality of radio frequencies and extract audio samples of a predetermined duration from each one of the plurality of radio frequencies having a signal strength above a reception threshold;
   a memory to store audio classification data and the plurality of audio samples; and
   an audio analyzer to analyze each one of the plurality of audio samples using the audio classification data and classify each audio sample into a musical style category.

2. The radio scanner of claim 1, further comprising:
   a style discriminator to control a radio station scanning operation of the radio receiver to tune only to preferred radio stations having a radio frequency at which the corresponding audio sample is classified in one of at least one preferred musical style category;
   wherein said at least one preferred musical style category is previously determined.

3. The radio scanner of claim 2, wherein said at least one preferred musical style category is previously determined by a selection by the user via the user's interaction with a control panel for the radio receiver.

4. The radio scanner of claim 2, wherein said at least one preferred musical style category is previously determined by monitoring radio stations of which the user tunes to for more than a predetermined listening period.

5. The radio scanner of claim 4, wherein a listening audio sample is extracted from each monitored radio station the user tunes to for more than a predetermined time, with each extracted listening audio sample being analyzed by the audio analyzer to determine said at least one preferred musical style category.

6. The radio scanner of claim 5, wherein the listening audio sample has a duration of several seconds to several hours.

7. The radio scanner of claim 6, wherein the listening audio sample has a duration of one minute.

8. The radio scanner of claim 2, wherein the memory includes a scan table listing the preferred radio stations and the style discriminator reads the scan table to control the radio receiver to tune only to preferred radio stations.

9. The radio scanner of claim 1, wherein to classify each one of the plurality of audio samples, the audio analyzer:
   segments the audio sample into a sequence of shorter segments;
   determines a mel-frequency spectral representation of each segment;
   derives a set of features from the cumulative spectral representations of the sequence of segments; and
   compares predetermined pattern classifiers to the set of features to determine the most likely musical style matching the audio sample.

10. The radio scanner of claim 9, wherein the set of features includes at least one of:
    the fraction of overall signal energy that is in different spectral frequency regions;
    the average absolute rate-of-change of energy in different frequency bins;
    the ratios of the energy of rate-of-change of energy between frequency bins; and
    the average correlation level between the amount of energy in different time-frequency regions.

11. The radio scanner of claim 9, wherein the pattern classifiers include at least one of decision trees, mixtures-of-gaussians, and nearest-neighbor classifiers.

12. The radio scanner of claim 9, (wherein each segment has a duration of 20–50 ms.

13. A radio comprising:
    a receiver to receive an RF signal and convert the RF signal to an audio signal;
    a phase-locked oscillator controllable to select a tuner frequency of the receiver;
    a scanning circuit operable to control the phase-locked oscillator; and
    a radio scanner to control the scanning circuit such that only preferred radio stations are tuned in by the receiver during a scanning procedure;
    said radio scanner comprising:
       a station monitoring circuit to scan a plurality of radio frequencies and extract audio samples of a predetermined duration from each one of the plurality of radio frequencies having a signal strength above a reception threshold;

a memory to store audio classification data and the plurality of audio samples; and an audio analyzer to analyze each one of the plurality of audio samples using the audio classification data and classify each audio sample into a musical style category.

14. The radio scanner of claim 13, further comprising:

a style discriminator to control a radio station scanning operation of the radio receiver to tune only to preferred radio stations having a radio frequency at which the corresponding audio sample is classified in one of at least one preferred musical style category;

wherein said at least one preferred musical style category is previously determined.

15. The radio scanner of claim 14, wherein said at least one preferred musical style category is previously determined by a selection by the user via the user's interaction with a control panel for the radio receiver.

16. The radio scanner of claim 14, wherein said at least one preferred musical style category is previously determined by monitoring radio stations of which the user tunes to for more than a predetermined listening period.

17. The radio scanner of claim 16, wherein a listening audio sample is extracted from each monitored radio station the user tunes to for more than a predetermined time, with each extracted listening audio sample being analyzed by the audio analyzer to determine said at least one preferred musical style category.

18. A method of scanning only preferred radio stations in a radio, said method comprising the steps of:

scanning a plurality of radio station frequencies and extracting audio samples from each one of the plurality of radio stations;

classifying each of the audio samples into one of a plurality of musical style categories;

determining a user's preferred musical styles;

storing a list of station identification data of radio stations having corresponding audio samples classified in the user's preferred musical styles; and scanning only the stations identified in said list during a scanning procedure of the radio.

19. The method of claim 18, wherein the user's preferred musical style is pre-selected from a plurality of predefined musical styles.

20. The method of claim 18, wherein the step of determining a user's preferred musical style comprises the steps of:

monitoring each one of a plurality of radio stations listened to by the user;

determining a corresponding musical style of each one of the plurality of listened to radio stations;

determining which of the corresponding musical styles the user most commonly listens to; and setting the most commonly listened to corresponding musical styles as the user's preferred musical styles.

21. The method of claim 20, wherein the step of determining a corresponding musical style comprises the steps of:

extracting listened to audio samples from each one of the plurality of listened to radio stations; and classifying each of the listened to audio samples into one of the plurality of musical style categories.

22. The method of claim 18, wherein the step of classifying each one of the audio samples comprises the steps of:

segmenting the audio sample into a sequence of shorter segments;

determining a mel-frequency spectral representation of each segment;

deriving a set of features from the cumulative spectral representations of the sequence of segments; and comparing predetermined pattern classifiers to the set of features to determine the most likely musical style matching the audio sample.

23. The method of claim 22, wherein the set of features includes at least one of:

the fraction of overall signal energy that is in different spectral frequency regions;

the average absolute rate-of-change of energy in different frequency bins;

the ratios of the energy of rate-of-change of energy between frequency bins; and the average correlation level between the amount of energy in different time-frequency regions.

24. The method of claim 22, wherein the pattern classifiers include at least one of decision trees, mixtures-of-gaussians, and nearest neighbor classifiers.

* * * * *